United States Patent [19]

Harjani

[11] Patent Number: 5,563,587
[45] Date of Patent: Oct. 8, 1996

[54] CURRENT CANCELLATION CIRCUIT

[75] Inventor: Ramesh Harjani, Minneapolis, Minn.

[73] Assignee: Rosemount Inc., Eden Prairie, Minn.

[21] Appl. No.: 215,321

[22] Filed: Mar. 21, 1994

[51] Int. Cl.$^6$ ............................................. G08C 19/00
[52] U.S. Cl. ............................................ 340/870.3; 330/9
[58] Field of Search .............................. 340/501, 511,
340/870.21, 870.3; 330/9, 51, 107, 294;
327/337, 341

[56] References Cited

U.S. PATENT DOCUMENTS

| | | | |
|---|---|---|---|
| 3,978,399 | 8/1976 | Chadbourne | 324/43 R |
| 4,142,117 | 2/1979 | Chang | 327/94 |
| 4,163,947 | 8/1979 | Weedon | 328/128 |
| 4,211,981 | 7/1980 | Lerma | 328/127 |
| 4,262,543 | 4/1981 | Grebe, Jr. et al. | 73/861.17 |
| 4,484,089 | 11/1984 | Viswanathan | 327/337 |
| 4,484,148 | 11/1984 | Wieser et al. | 330/294 |
| 4,543,543 | 9/1985 | Temes et al. | 330/9 |
| 4,783,659 | 11/1988 | Frick | 340/870.21 |
| 4,893,088 | 1/1990 | Myers et al. | 327/337 |
| 4,962,325 | 10/1990 | Miller et al. | 307/353 |
| 4,962,328 | 10/1990 | Wöss et al. | 307/491 |
| 5,023,474 | 6/1991 | Wilcox | 307/270 |
| 5,039,874 | 8/1991 | Anderson | 307/270 |
| 5,051,620 | 9/1991 | Burgin | 307/452 |
| 5,179,301 | 1/1993 | Hughes | 307/490 |
| 5,189,318 | 2/1993 | Tanaka | 307/352 |
| 5,192,881 | 3/1993 | Martin | 307/468 |
| 5,262,689 | 11/1993 | Glica et al. | 307/570 |

FOREIGN PATENT DOCUMENTS

| | | |
|---|---|---|
| 377132 | 6/1984 | Germany . |
| 3632221A1 | 4/1987 | Germany . |

*Primary Examiner*—Jeffery Hofsass
*Assistant Examiner*—Timothy Edwards, Jr.
*Attorney, Agent, or Firm*—Westman, Champlin & Kelly, P.A.

[57] ABSTRACT

A transmitter includes a sensor for sensing a primary process variable representative of a process, and providing a sensor output current. An integrator in the transmitter integrates the sensor output current. The integrator has an amplifier on an integrated circuit and an off-chip capacitor coupled between the inverting input on the amplifier and the amplifier output via two integrated circuit pads, which leak undesirable leakage current to the integrator. A leakage cancellation circuit is selectively connectable to the inverting input of the amplifier in the integrator, the cancellation circuit providing a current substantially opposite in polarity and equal in magnitude to the leakage current as a function of a stored voltage representative of the magnitude of the leakage current. A microprocessor based compensation circuit compensates the output of the integrator for repeatable errors which affect the process variable. A formatting circuit couples the compensated process variable to a two wire current loop.

18 Claims, 5 Drawing Sheets

5,563,587

CURRENT CANCELLATION CIRCUIT

BACKGROUND OF THE INVENTION

This invention relates to a current sensitive circuit in a field instrument, the circuit for integrating the current entering the circuit, and more particularly, to such circuits which are used in high resolution, continuous measurement applications in the process control industry.

Field instruments include two, three and four wire transmitters which sense a process variable in a process control application and transmit a signal representative of the sensed process variable to a controller. Field instruments also include valve controllers which receive a 4–20 mA current representative of a desired valve position, and provide a pneumatic output as a function of a sensed valve position and the desired valve position. Both transmitters and valve controller operate exclusively on the 4–20 mA current they receive, and can therefore consume only limited amounts of power. Both types of field instruments have analog-to-digital Converters which receive a current from a sensor sensing the process variable and integrate the sensed current in high resolution analog-to-digital converters. Unfortunately, the limited amount of available power and the high degree of resolution required in the instrument mandates that the converters integrate the sensed current over a long integration period, making the measurement suspectable to small leakage currents.

Various types of circuits which cancel, or compensate, for an input offset voltage on an operational amplifier are known. Direct mode cancellation of input offset voltages on an operational amplifier (op-amp) is a commonly used technique in switched capacitor circuits. One type of direct mode cancellation is correlated double sampling, where switches disconnect the voltage input to an amplifier while storing a sample of the offset voltage on a capacitor. After the switches re-connect the voltage input to the amplifier, the stored offset voltage is differenced from the voltage input so that the effective offset is zero. Auto-zeroing techniques, such as the ones described above, are ill-suited for a current measuring application, which only needs to compensate for excessive input leakage current. Additionally, since the voltage input is disconnected from the amplifier in order to provide compensation, this technique is unsuitable for continuous input current sensing circuits.

Another direct mode cancellation technique is chopper stabilization, where the input offset voltage is modulated to a higher frequency and filtered with a lowpass filter. However, the modulation scheme necessitates that the amplifier inputs be disconnected momentarily, rendering this technique also unsuitable for continuous input current sensing.

Two indirect mode techniques for input offset voltage cancellation are also known. In a first technique a current representative of the input offset voltage is created inside the amplifier and a floating gate MOS trim transistor is programmed with a sufficiently large voltage so as to provide enough current to cancel the offset voltage. This technique has inaccuracies because the compensation current created internally does not take into account the temperature and manufacturing process dependencies of the input offset voltage. The other indirect technique uses auxiliary voltage inputs with reduced sensitivity to compensate for amplifier input offset voltage. While this technique provides a continuous time virtual ground and is dynamic, in that the input offset voltage is sensed continuously, this scheme shares the same output as the normal amplifier. A cancellation scheme with shared output such as this overcompensates for the leakage current entering the output, since leakage currents which occur at the input affect the integrator transfer function over a different range of frequencies than do leakage currents occurring at the output. The industry usage of integrators is primarily in the frequencies affected the input leakage current.

There is thus a need for a current cancellation circuit couplable to a transconductance amplifier circuit which substantially cancels the input leakage current but does not compensate for the leakage current at the amplifier's output, where the cancellation circuit operates continuously, is selectively programmable and provides an unaltered operational transconductance amplifier output current.

SUMMARY OF THE INVENTION

A transmitter includes a sensor for sensing a primary process variable representative of a process, and providing a sensor output current. An integrator in the transmitter integrates the sensor output current. The integrator has an amplifier on an integrated circuit and an off-chip capacitor coupled between the inverting input on the amplifier and the amplifier output via two integrated circuit pads, which leak undesirable leakage current to the integrator. A leakage cancellation circuit is selectively connectable to the inverting input of the amplifier in the integrator, the cancellation circuit providing a current substantially opposite in polarity and equal in magnitude to the leakage current as a function of a stored voltage representative of the magnitude of the leakage current. A microprocessor based compensation circuit compensates the output of the integrator for repeatable errors which affect the process variable. A formatting circuit couples the compensated process variable to a two wire current loop. In another embodiment, a current cancellation circuit such as disclosed here is used in conjunction with an integrator to sense position of a valve in a valve controller.

DETAILED DESCRIPTION OF THE PREFERRED EMBODIMENTS

Figure 1:
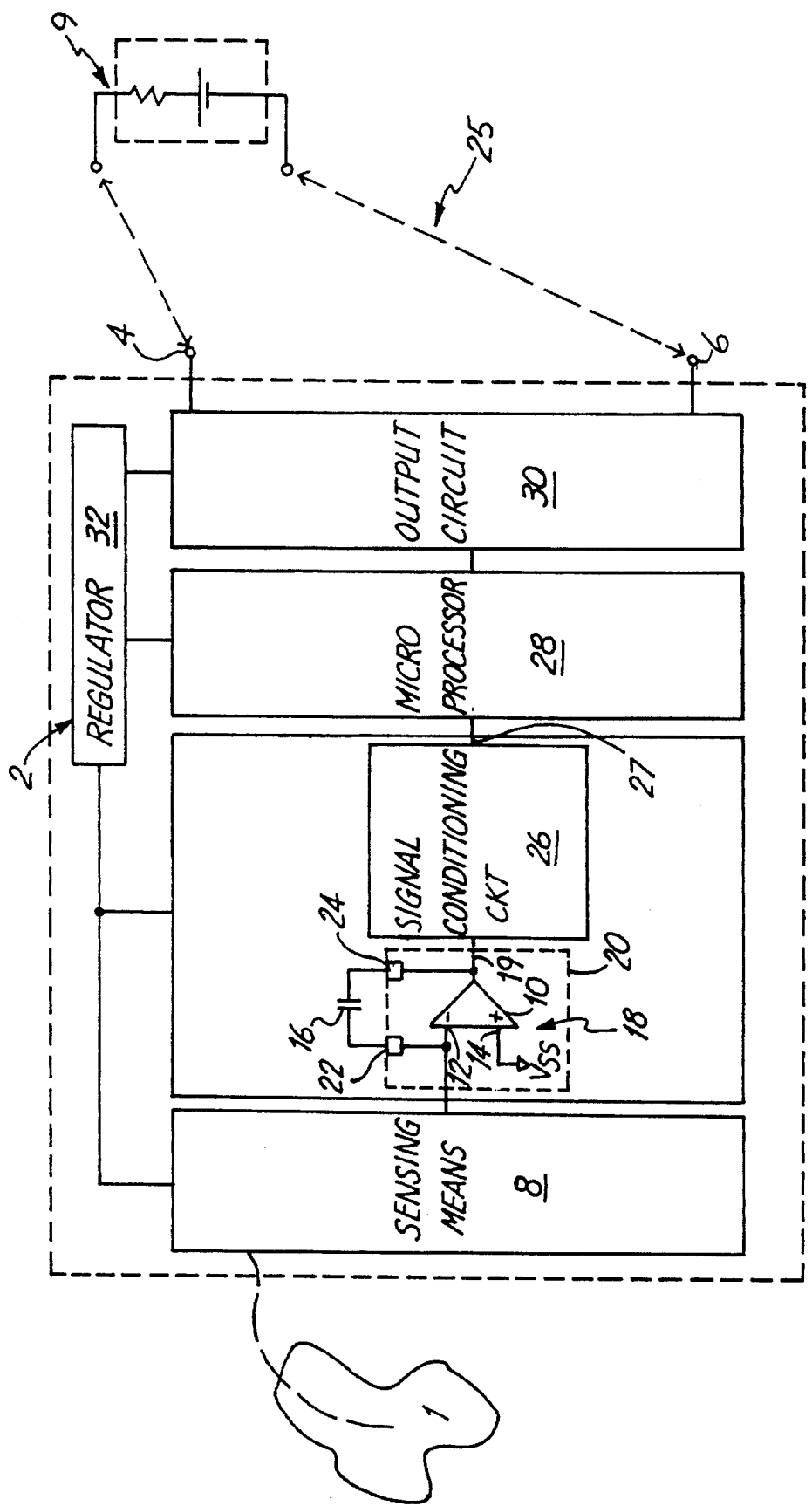
FIG. 1 is a schematic of a transmitter including an integrator where leakage current poses a problem.

FIG. 1 shows a situation in the prior art where leakage current is undesirable. A two wire transmitter, shown generally at 2 is couplable to a loop controller shown generally at 9 via terminals 4 and 6. Loop controller 9 has a resistance and a power supply in series. All operating power for transmitter 2 is supplied by loop controller 9. A sensing means 8 in transmitter 2 senses a process variable representative of a process 1 and provides a current representative of the process variable to an integrator 18. A sense amp 10 in integrator 18 has an inverting input 12 connected to the output from means 8, a non-inverting input 14 connected to a reference potential $V_{SS}$, and a capacitor 16 connected between input 12 and an output 19 of sense amp 10. Sense amp 10 is a transconductance amplifier, in that its inputs are potentials and the output is a current substantially proportional to the difference between the input potentials. Amp 10 is fabricated on an integrated circuit 20, shown as a dashed line. Capacitor 16 is located off-chip and connected to amp 10 on circuit 20 via integrated circuit pads 22 and 24. Off chip integrating capacitors are often used in high performance analog to digital converter circuits, such as this, because the necessary capacitor size is impractical to integrate in today's technologies and because the current quality of external off-chip capacitors is often better than on-chip capacitors. This current impracticality does not preclude the use of the present invention in an on-chip integrator configuration should the size and quality limitations be eliminated. In order to prevent electrostatic discharge from damaging the electronics on integrated circuit 20, pads 22 and 24 contain large electrostatic discharge (ESD) protection diodes having dimensions on the order of a few thousand microns. These large protection diodes contribute substantial leakage current, which is directly added to inverting input 12 and is indistinguishable from the current which integrator 18 measures. The leakage current doubles every 8° C. temperature and is also voltage dependent. The current is a combination of reverse bias diode leakage current and gate induced drain leakage. The magnitude of the leakage current varies substantially and is a function of many variables including the quality of the fabrication process for circuit 20. Typical leakage current values for this current range from a few picoamperes to tens of nanoamperes.

Output 19 couples to a signal processing circuit 26 to provide optional level shifting and noise filtering functions, depending on the type of signal received from sensing means 8. Signal conditioning circuit 26 also digitizes the integrated sensed current signal. The digitized output from circuit 26 is representative of the process variable and is connected along line 27 to a microprocessor 28 for compensation. Microprocessor 28 compensates the digitized process variable for repeatable errors in the sensor. The compensated microprocessor output is connected to output circuit 30, which formats and couples the compensated process variable onto a current loop formed by transmitter 2 and controller 9. A regulator 32 provides power ($V_{DD}$ and $V_{SS}$) to all the circuitry in transmitter 2. Output circuit 30 can may be realized in several ways. A first alternative is a digital-to-analog circuit where the compensated process variable is converted to an analog current representative of the compensated process variable and is thereafter coupled onto loop 25. A second alternative is a fully digital transmission (e.g. Fieldbus) of the compensated process variable onto loop 25. A third implementation superimposes a digital signal representative of the process variable on an analog current also representative of the process variable, such as in the HART® protocol.

Figure 2:
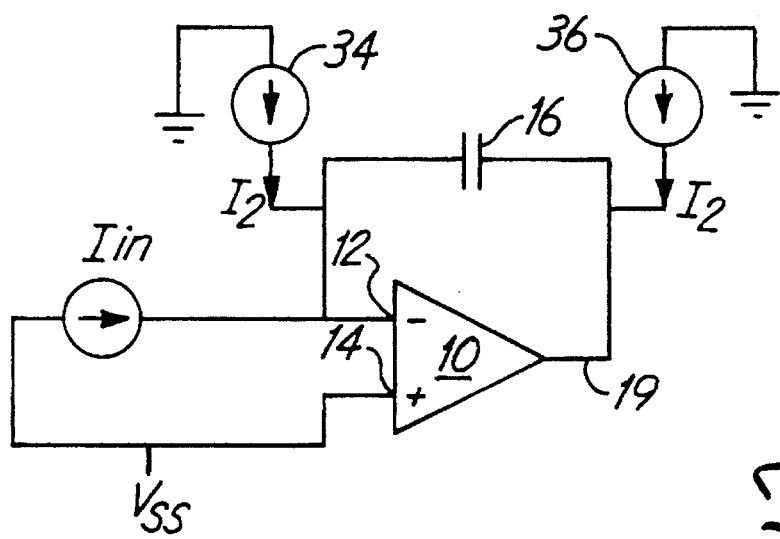
FIG. 2 is a schematic of a model of a portion of the circuit in FIG. 1.

FIG. 2 shows a simplified circuit model of a portion of transmitter 2, including transconductance amplifier 10, external capacitor 16, and leakage current sources 34 and 36 contribute currents $I_1$ and $I_2$, respectively, as models of leakage from pads 22 and 24. The current from sensing means 8 is modelled as current source $I_{IN}$. The inverting input 12 of amplifier 10 is connected to current source $I_{IN}$ and the non-inverting input 14 is connected to $V_{SS}$. The output of leakage current source $I_1$ is also connected to inverting input 12 whereas the output of current source $I_2$ connects to the output of amplifier 10, labelled at 19. The output voltage $V_o$ is given by Equation 1:

Equation 1:

$$V_0 = \frac{-(I_{IN} + I_1)}{SC_{16}} + \frac{(I_{IN} + I_1 + I_2)}{g_{m_1}}$$

where $I_{IN}$ is the sensing current, $I_1$ and $I_2$ are the leakage currents, S is the complex frequency, $C_{16}$ is the capacitance of capacitor 16 and $g_{M1}$ is a transconductance constant of amplifier 14.

Figure 3:
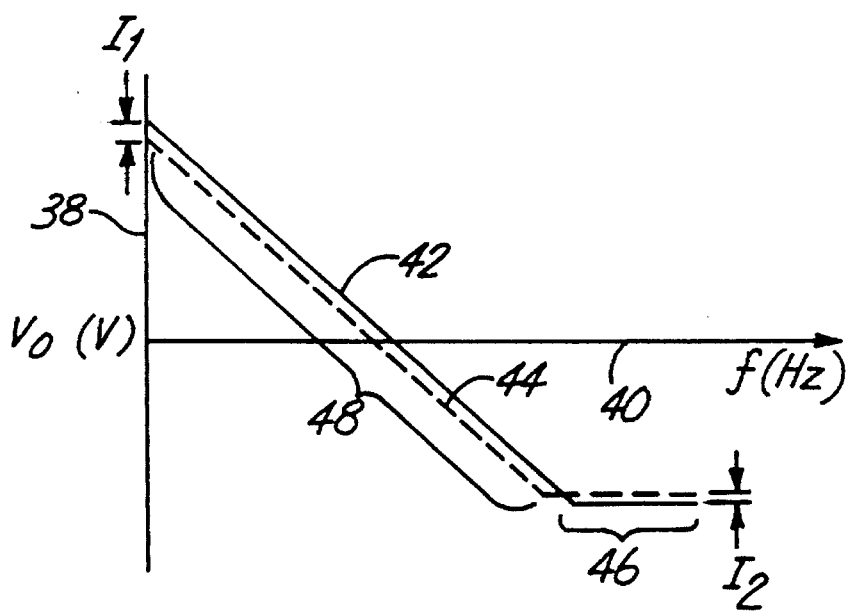
FIG. 3 is a plot of $V_O$ as a function of frequency.

FIG. 3 shows a plot of output potential $V_0$, plotted on a y axis 38 as a function of frequency plotted on an x axis 40. A solid line indicated at 42 shows the $V_0$ characteristic when leakage current $I_1$ and $I_2$ are set to zero. A dashed line indicated at 44 shows the $V_0$ characteristic when leakage current $I_1$ and $I_2$ are at non-zero levels. Leakage current $I_2$ is responsible for increasing the magnitude of $V_0$ in the flat portion of the response, indicated at 46. $I_1$ has a much larger impact on the integrator transfer function, since it is responsible for decreasing $V_0$ over all operating frequencies, indicated on the plot at 48. The effect of $I_1$ is indistinguishable from $I_{IN}$, and it is therefore critical to cancel the effect of $I_1$ leakage current in order to improve the resolution of the circuit.

Figure 4:
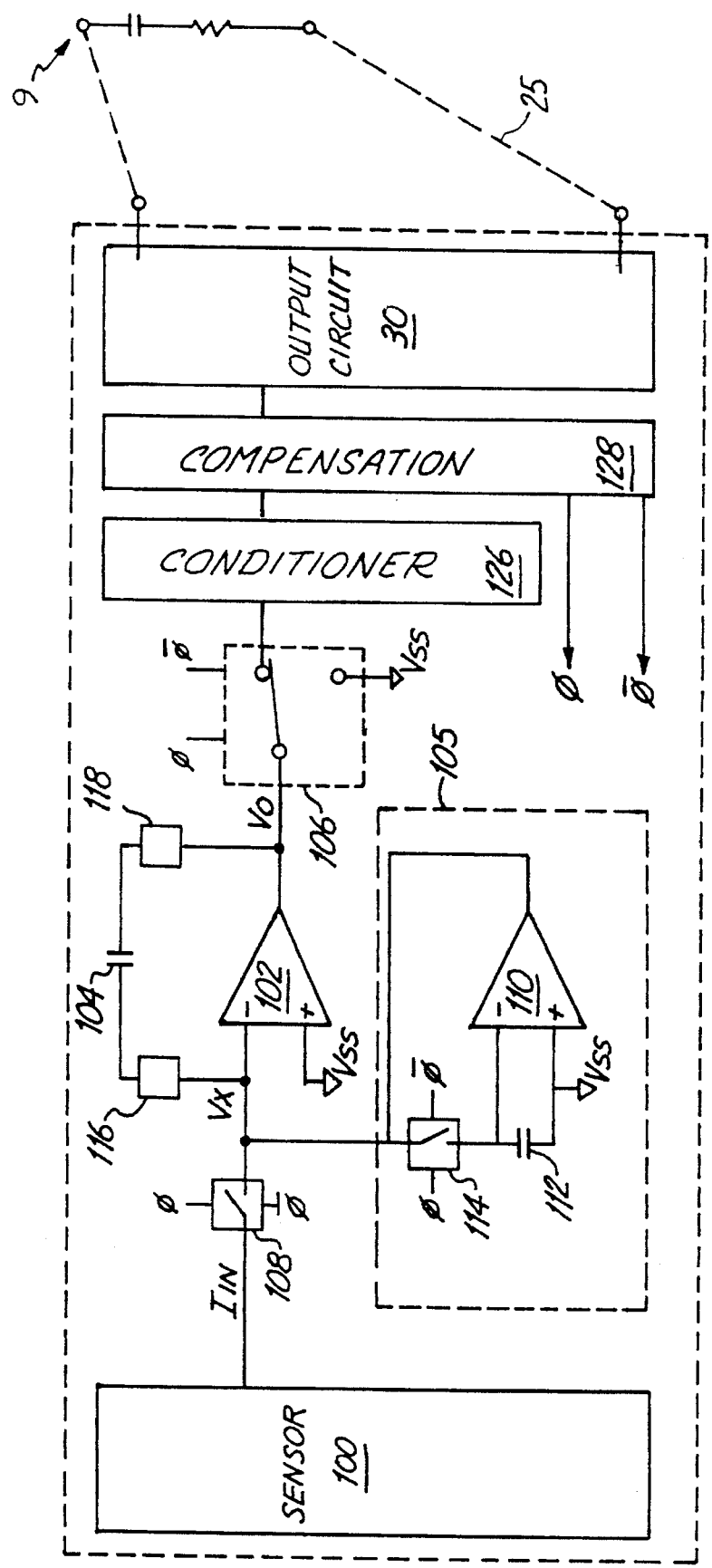
FIG. 4 is a schematic of the present invention.

FIG. 4 shows an embodiment of a two wire transmitter having a leakage cancellation circuit according to the present invention. Three and four wire transmitters are equally adaptable to the present invention. A sensing circuit 100 senses a process variable representative of a process and provides an output current $I_{IN}$ to the inverting input of a transconductance amplifier 102 through a switch 108. Transconductance amplifier 102 and an external capacitor 104, connected to each other through integrated circuit pads 116 and 118, form a high resolution continuous time integrator which is operated for times as long as 100 microseconds to provide an analog signal representative of the sensed process variable. Switch 106 connects the output of amplifier 102 to signal conditioning circuit 126 or alternatively to $V_{SS}$, depending on the state of switch control signal ø and its complement. Signal conditioning circuit 126 filters and level shifts the integrator out-put to produce a digitized integration output. The integrator output is connected to a compensation circuit 128 through conditioning circuit 126 for digitizing and compensating the digitized process variable for repeatable errors in the sensor. Compensation circuit 128 is preferably realized in a low power technology such as CMOS and generates signal ø and its complement for use in switches 106, 108 and 114. The compensated process variable from circuit 128 is connected to output circuit 30 and thereafter to loop 25 and controller 9, all of which operate as described previously.

Another transconductance amplifier 110, a capacitor 112 and a switch 114 form the leakage current compensation circuit 105 of the present invention. Undesirable leakage current caused by ESD pad 116 enters the inverting input of amplifier 102. The normal operating position of switch 106 is a position linking the signal conditioning circuit 126. The normal operating position of switches 108 and 114 are closed and opened, respectively. During these normal operating positions, leakage compensation circuit 105 is effectively disconnected from the current integrator circuit of amplifier 102 and capacitor 104, except for the current supplied by amplifier 110. During a leakage current measurement sequence, switch 108 is opened so as to disconnect circuit 100 from the input to amplifier 102. Switch 106 is switched to $V_{SS}$ so that the leakage current contributed by pad 118 is directed to $V_{SS}$ as is any current generated by primary amplifier 102. Switch 114 is closed so that leakage current $I_1$ charges capacitor 112. The current entering the inverting input of amplifier 102 is substantially the undesirable leakage current $I_1$. Amplifier 110 outputs a current substantially equal to the voltage across capacitor 112 multiplied by the transconductance gain $g_{M2}$ of amplifier 110. The transconductance constant $g_{M2}$ of amplifier 110 should have a value within a preferred range. It should be small enough to maximize the differential voltage swing presented to switch 114, so as to minimize charge injection error, but should be large enough so that the final voltage on capacitor 112 is smaller than the difference in potential between $V_{DD}$ and $V_{SS}$. The output of amplifier 110 is connected to the inverting input of amplifier 102 and the current provided by amp 110 is substantially equal to the leakage current $I_1$. The voltage across capacitor 112 slowly rises until the current provided by amplifier 110 is of an opposite polarity and substantially equal to leakage current $I_1$. The value of this voltage is given by Equation 2:

Equation 2:

$$V = \frac{g_{m2}}{I_1}$$

The leakage current measurement sequence can be initiated before each new integration cycle for high accuracy circuits, or can be initiated when the transmitter is installed in a new application.

After the leakage current measurement phase, switch 114 is opened and switch 106 is switched to circuit 126 and switch 108 is closed. The voltage across capacitor 112 is still equal to that given by Equation 2. Therefore, the current supplied by amplifier 110 is still maintained at $-I_1$ and effectively cancels leakage current $I_1$. Leakage current $I_1$ is sampled only when necessary and not necessarily at every clock cycle as in other offset compensation techniques.

Leakage cancellation circuits which use a single transconductance amplifier for both the integrator and for the cancellation function are sub-optimal, since the transconductance constant for integrators is preferably large but is preferably small for a low current application like leakage cancellation. Additionally, a circuit which uses the integrator transconductance amplifier for compensation also cannot distinguish between the currents $I_1$ and $I_2$. Therefore, such an implementation tends to overcompensate for the leakage current, resulting in an error of opposite magnitude, $-I_2$. It is also preferred that amplifier 102 and 110 are implemented on the same integrated circuit and that the circuit be processed in a low power technology such as CMOS or BICMOS to conserve power. For an external capacitor of approximately 1000 pF the transconductance constant for amplifier 102 should be at least 800 micromhos, and for a capacitor in the cancellation circuit of approximately 10 pF, the transconductance constant of amplifier 110 should be at most 3.0 micromhos. A transconductance constant of 900 micromhos and one of 1.8 micromhos are respectively preferred for amplifiers 102 and 110.

Figure 5:
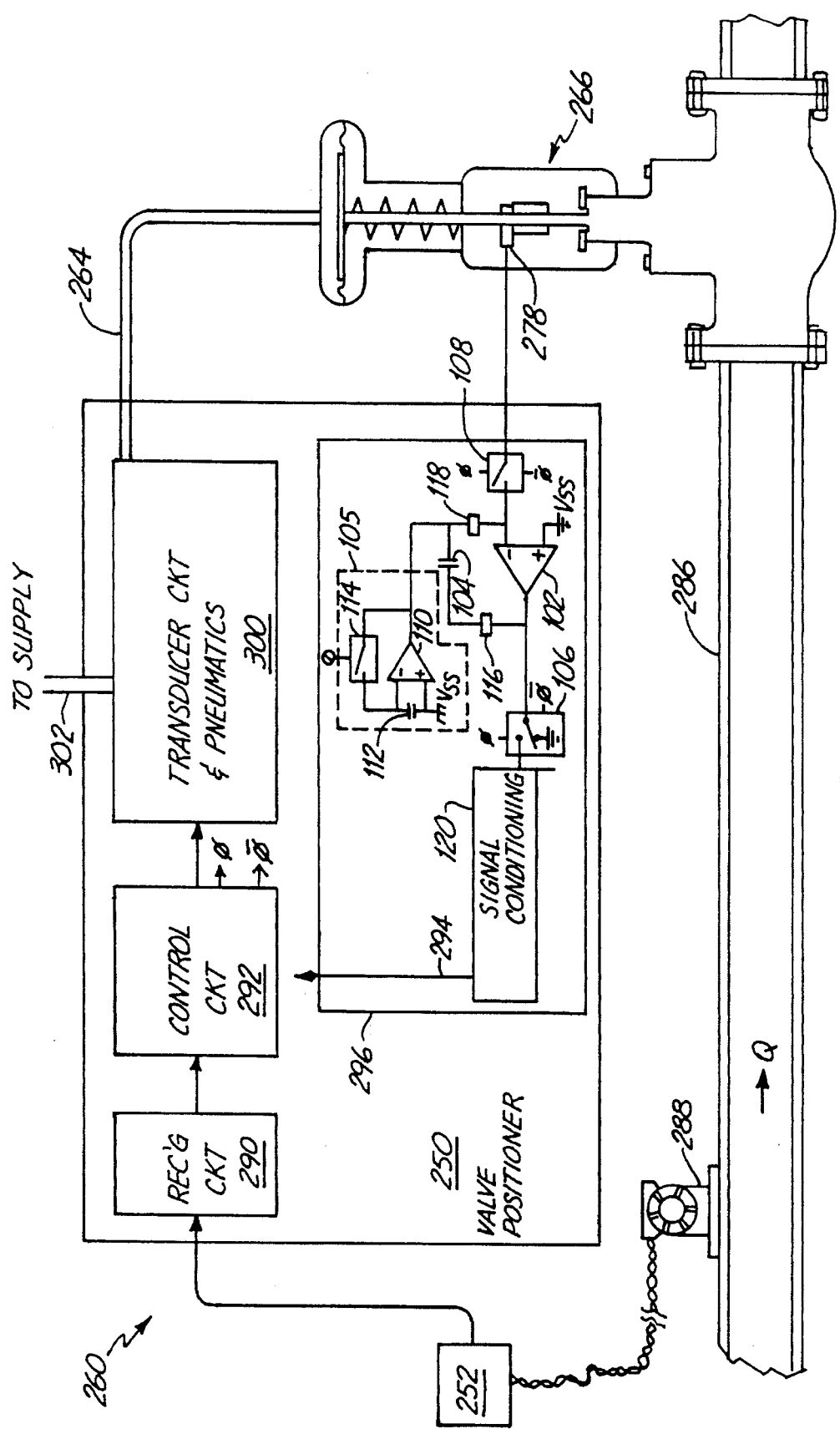
FIG. 5 is a schematic of an alternative embodiment of the present invention.

In FIG. 5, a valve positioner 250 is shown in a control loop, shown generally at 260. Positioner 250 receives a 4–20 mA current from a controller 252, and provides a pneumatic output at 264 to a valve, shown generally at 266. Valve 266 controls the flow Q in a pipe 286, and the flow is sensed by a transmitter 288. A receiving circuit 290 in positioner 250 receives the current, which is representative of the desired position of valve 266. A position sensor 278 outputs a current to an integrating circuit 296. Circuit 296 provides an integrated output to a control circuit 292 which combines the integrated output with the desired valve position signal and a PID algorithm to produce a control signal. A transducer circuit and pneumatics section 300 regulates a supply of air 302 according to the control signal.

Integrating circuit 296 includes those analog components discussed and numbered as in FIG. 4. A transconductance amplifier 102 and an external capacitor 104, connected across the input and output of amplifier 102 through integrated circuit pads 116 and 118 to form a high resolution integrator for integrating the sensed position signal. Switch 106 connects the output of amplifier 102 to signal conditioning circuit 120 or alternatively to $V_{SS}$, depending on the state of switch control signal ø and its complement. The ø signal and its complement are generated by the control circuit 292. Circuit 120 level shifts and filters the integrator output as appropriate to produce position signal 294.

Another transconductance amplifier 110, a capacitor 112 and a switch 114 form the leakage current compensation circuit 105 of the present invention. Undesirable leakage current caused by ESD pad 116 enters the inverting input of amplifier 102. The normal operating position of switches 106, 108 and 114 are connected to signal conditioning circuit 120, closed and opened, respectively. During these normal operating positions, leakage compensation circuit 105 is effectively disconnected from the current integrator circuit of amplifier 102 and capacitor 104, except for the current supplied by amplifier 110. During a leakage current measurement sequence, switch 108 is opened so as to disconnect circuit 100 from the input to amplifier 102. Switch 106 is closed, and the leakage current contributed by pad 118 is directed to $V_{SS}$ as is any current generated by primary transconductance amplifier 102. Switch 114 is closed so that leakage current $I_1$ charges capacitor 112. The current entering the inverting input of amplifier 102 is substantially the undesirable leakage current $I_1$. Amplifier 110 outputs a current substantially equal to the voltage across capacitor 112 multiplied by the transconductance gain $g_{M2}$ of amplifier 110. The output of amplifier 110 is connected to the inverting input of amplifier 102 and the current provided by amp 110 is substantially equal to the leakage current $I_1$. The voltage across capacitor 112 slowly rises until the current provided by amplifier 110 is of an opposite polarity and substantially equal to leakage current $I_1$.

Figure 6A:
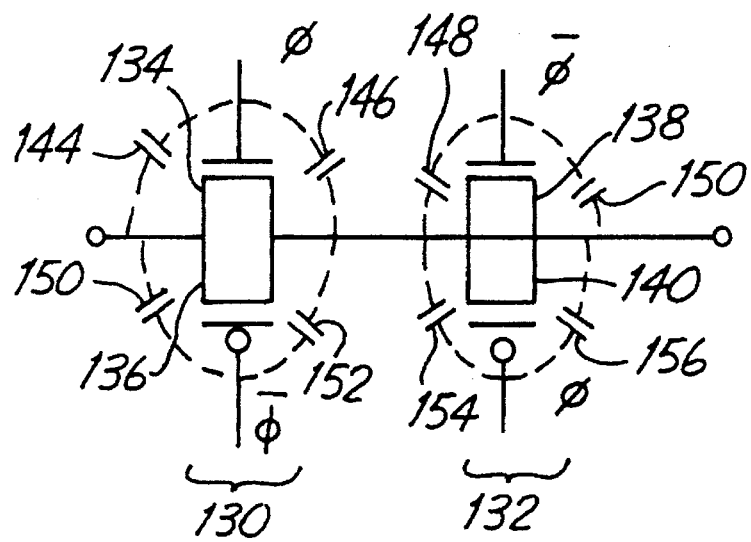
FIG. 6A is a detailed schematic of switches in FIG. 4.
Figure 6B:
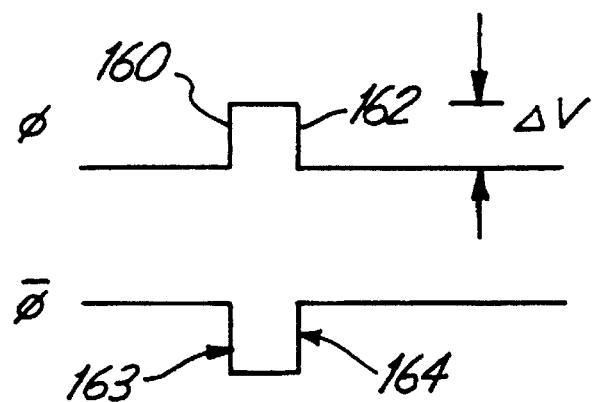
FIG. 6B is a timing diagram related to the operation of switches in FIG. 5A.

In FIG. 6A each of the switches 104, 106 and 114 include a standard NMOS/PMOS switch 130 and a half-dummy compensation device 132. The combination of the switch and the compensation device in series as shown reduces clock feedthrough, an undesirable amount of charge swept from the channel when the switch is turned-off and from discharging the overlap capacitance (the capacitance between the gate and the drain or the source). Standard switch 130 includes an NMOS transistor 134 and a PMOS transistor 136. Similarly, half-dummy compensation device 132 includes an NMOS transistor 138 and a PMOS transistor 140. A logic control signal ø is connected to the gate of NMOS transistor 134 and to the gate of PMOS transistor 140. The complement of signal ø is connected to the gate of transistors 136 and 138. Parasitic capacitances 142&156 exist between the gate and the drain and the gate and the source of each of the transistors 134&140. Transistors 138,140 in device 132 are one-half the size of transistors 134,136 in device 130, so that parasitic capacitances 148, 150,154,156 on device 132 are one-half the capacitances of 144,146,150,152 on switch 130. 0n the falling edge of signal ø the charge on capacitor 146 is injected into the signal path by an amount $\Delta Q = C \Delta V$. The falling edge 162 (in FIG. 6B) of signal ø is essential contemporaneous with the rising edge 164 (in FIG. 6B) of the complement of signal ø. Therefore, during rising edge 164 and falling edge 162, a charge +ΔQ=2(C/2)ΔV, corresponding to the charge on capacitors 148 and 150, is effectively subtracted from the signal path. Similarly, for the PMOS transistors, the charge injected is substantially subtracted from the signal path. This arrangement of two series switches where one switch has half the width of the other, coupled with the complementary switch signals controlling those switches, reduces the amount of clock feedthrough associated with operating the switches. Devices of the same type are equivalently sized in both width and length to minimize clock feedthrough. The amount of leakage associated with the junction area is a secondary contribution to charge leakage, and can be minimized by selecting small devices.

Although the present invention has been described with reference to preferred embodiments, workers skilled in the art will recognize that changes may be made in form and detail without departing from the spirit and scope of the invention.

What is claimed is:

1. A transmitter, comprising:

a sensor for sensing a process variable representative of a process, the sensor providing a sensor output current;

an integrator having an input and an output representative of the integral of current entering the input, the input susceptible to a leakage current entering therein;

a compensation circuit connected to the output of the integrator, for compensating the output for repeatable errors which affect the process variable; an output circuit for coupling the compensated output to a two wire current loop; and a cancellation circuit connected to the integrator input, the circuit periodically sampling the leakage current and providing a current to the integrator input substantially opposite in polarity and substantially equal in magnitude to the leakage current as a function of a stored charge representative of the magnitude of leakage current.

2. The transmitter of claim 1 including selective connections comprising switches and a compensation device selectively coupling the cancellation circuit to the integrator.

3. The transmitter of claim 2 where each switch comprises a NMOS and a PMOS device, and where the NMOS transistors in each switch have substantially the same dimensions and where the PMOS transistors in each switch have substantially the same dimensions.

4. The transmitter of claim 2 where each compensation device and each switch comprises a NMOS and a PMOS device, and where the transistors of each compensation device have substantially one-half the width of the transistors in the switch.

5. The transmitter of claim 1 where the integrator includes an integrator transconductance amplifier and a capacitor having one terminal connected to the input of the integrator and another terminal connected to the output of the integrator.

6. The transmitter of claim 5 where the integrator transconductance amplifier has a transconductance constant greater than 800 micromhos.

7. The transmitter of claim 1 where the cancellation circuit comprises a cancellation transconductance amplifier and where the stored charge is stored on a capacitor having its terminals connected across the inputs of the cancellation transconductance amplifier.

8. The transmitter of claim 7 where the cancellation transconductance amplifier has a transconductance constant of less than 3 micromhos.

9. An integrated circuit, comprising:

a first amplifier having an input connectable to a first capacitor through an input pad and an output connectable to the other terminal of the capacitor through an output pad, the input pad having a leakage current associated therewith;

a cancellation circuit having a second amplifier, the amplifier having a second capacitor connected across its inputs, the second capacitor having one terminal selectably connectable to the input of the first amplifier for sampling the leakage current, the second amplifier providing a cancellation current as a function of a potential difference across the second capacitor, where the cancellation current has a magnitude substantially equal to and a polarity opposite of the leakage current.

10. The circuit of claim 9 where the selective connections comprise a switch and a compensation device.

11. The circuit of claim 10 where each switch comprises a NMOS and a PMOS device, and where the NMOS transistors in each switch have substantially the same dimensions and where the PMOS transistors in each switch have substantially the same dimensions.

12. The circuit of claim 10 where each compensation device and each switch comprises a NMOS and a PMOS device, and where the transistors of each compensation device have substantially one-half the width of the transistors in the switch.

13. The circuit as claimed in claim 9 where the integrated circuit is CMOS.

14. The circuit as claimed in claim 9 where the integrated circuit is BICMOS.

15. The circuit of claim 9 where the first and the second amplifiers are transconductance amplifiers.

16. The circuit of claim 9 where the first amplifier has a transconductance constant greater than 800 micromhos.

17. The circuit of claim 9 where the second amplifier has a transconductance constant of less than 3 micromhos.

18. The transmitter of claim 1 including:

a first switch selectively coupling the input of the integrator to the sensor output;

a second switch selectively coupling the output of the integrator to the compensation circuit;

a third switch selectively coupling the cancellation circuit to the input of the integrator; and wherein during normal operation the first and second switches are closed and the third switch is open and during leakage current measurement the first and second switches are open and the third switch is closed.

* * * * *